(12) United States Patent
Passlack (10) Patent No.: US 9,614,070 B2
(45) Date of Patent: Apr. 4, 2017

(54) FIELD EFFECT TRANSISTOR WITH CONDUCTION BAND ELECTRON CHANNEL AND UNI-TERMINAL RESPONSE

(71) Applicant: Taiwan Semiconductor Manufacturing Company, Ltd., Hsin-Chu (TW)

(72) Inventor: Matthias Passlack, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 134 days.

(21) Appl. No.: 14/559,521

(22) Filed: Dec. 3, 2014

(65) Prior Publication Data

US 2015/0076513 A1 Mar. 19, 2015

Related U.S. Application Data (62) Division of application No. 12/974,954, filed on Dec. 21, 2010, now Pat. No. 9,209,180.

(Continued)

(51) Int. Cl.
*H01L 29/15* (2006.01)
*H01L 31/0256* (2006.01)
(Continued)

(52) U.S. Cl.
CPC .......... *H01L 29/7787* (2013.01); *B82Y 10/00* (2013.01); *H01L 27/088* (2013.01); *H01L 27/092* (2013.01); *H01L 29/122* (2013.01); *H01L 29/155* (2013.01); *H01L 29/20* (2013.01); *H01L 29/205* (2013.01); *H01L 29/432* (2013.01); *H01L 29/7783* (2013.01); *H01L 21/8252* (2013.01); *H01L 29/201* (2013.01); *H01L 29/517* (2013.01); *H01L 31/03046* (2013.01); *H01L 31/035236* (2013.01); *H01L 31/1844* (2013.01)

(58) Field of Classification Search
CPC ....... H01L 31/035236; H01L 31/03046; H01L 31/1844
See application file for complete search history.

(56) References Cited

U.S. PATENT DOCUMENTS

4,163,237 A 7/1979 Dingle et al.
4,792,832 A 12/1988 Baba et al.
(Continued)

*Primary Examiner* — Zandra Smith
*Assistant Examiner* — John M Parker
(74) *Attorney, Agent, or Firm* — Haynes and Boone, LLP (57) ABSTRACT

A uni-terminal transistor device is described. In one embodiment, an n-channel transistor comprises a first semiconductor layer having a discrete hole level $H_0$; a second semiconductor layer having a conduction band minimum $E_{C2}$; a wide bandgap semiconductor barrier layer disposed between the first and the second semiconductor layers; a gate dielectric layer disposed above the first semiconductor layer; and a gate metal layer disposed above the gate dielectric layer and having an effective workfunction selected to position the discrete hole level $H_0$ below the conduction band minimum $E_{c2}$ for zero bias applied to the gate metal layer and to obtain n-terminal characteristics.

20 Claims, 5 Drawing Sheets

Related U.S. Application Data (60) Provisional application No. 61/303,025, filed on Feb. 10, 2010.

(51) Int. Cl.
| | |
|---|---|
| *H01L 29/778* | (2006.01) |
| *B82Y 10/00* | (2011.01) |
| *H01L 29/12* | (2006.01) |
| *H01L 29/205* | (2006.01) |
| *H01L 29/43* | (2006.01) |
| *H01L 27/092* | (2006.01) |
| *H01L 29/20* | (2006.01) |
| *H01L 27/088* | (2006.01) |
| *H01L 31/18* | (2006.01) |
| *H01L 31/0352* | (2006.01) |
| *H01L 31/0304* | (2006.01) |
| *H01L 29/201* | (2006.01) |
| *H01L 29/51* | (2006.01) |
| *H01L 21/8252* | (2006.01) |

(56) References Cited

U.S. PATENT DOCUMENTS

| | | |
|---|---|---|
| 5,068,756 A | 11/1991 | Morris et al. |
| 5,349,214 A | 9/1994 | Tehrani et al. |
| 5,355,005 A | 10/1994 | Tehrani et al. |
| 6,232,624 B1 | 5/2001 | Matloubian et al. |
| 6,656,823 B2 | 12/2003 | Lee et al. |
| 7,157,299 B2 | 1/2007 | Yang et al. |
| 7,276,723 B2 | 10/2007 | Fathimulla et al. |
| 2011/0193091 A1* | 8/2011 | Passlack ......... H01L 21/823807 257/76 |

\* cited by examiner

FIELD EFFECT TRANSISTOR WITH CONDUCTION BAND ELECTRON CHANNEL AND UNI-TERMINAL RESPONSE

CROSS-REFERENCE

This application is a divisional application of U.S. Ser. No. 12/974,954 filed Dec. 21, 2010, entitled "Field Effect Transistor with Conduction Band Electron Channel and Uni-terminal Response," which is hereby incorporated by reference in its entirety. This application claims the benefit of U.S. Ser. No. 61/303,025 filed Feb. 10, 2010, the disclosure of which is hereby incorporated by reference in its entirety.

BACKGROUND

The present disclosure relates to field effect transistors ("FETs") with uni-terminal response, and more specifically to a common epitaxial layer structure that forms channels comprising conduction band electrons for both positive and negative gate bias for use in FETs with both n- and p-terminal characteristics.

Traditional complementary metal-oxide semiconductor ("CMOS") technology utilizes conduction band electrons to form the conducting channel in devices with n-terminal characteristics and valence band electrons (holes) in devices with p-terminal characteristics. The terminal characteristics of n-channel and p-channel devices are referred to as "complementary". When such complementary devices are connected in series, they form a basic logic gate, or an inverter. This basic complementary design has dominated digital electronics for decades because of its simplicity and low power dissipation; however, the performance of devices with p-channel characteristics is inferior to devices with n-channel characteristics because valence band electrons, or holes, exhibit substantially less mobility than conduction band electrons. This limits the performance of CMOS inverters.

Prior art has described the formation of a conducting channel utilizing conduction band electrons for both devices with p- and n-terminal characteristics (see, e.g., U.S. Pat. No. 5,355,005). However, each type of device uses its own epitaxial layer structure, which complicates manufacture and increases costs.

SUMMARY

One embodiment is an n-channel transistor comprising a first semiconductor layer having a discrete hole level $H_0$; a second semiconductor layer having a conduction band minimum $E_{C2}$; a wide bandgap semiconductor barrier layer disposed between the first and the second semiconductor layers; a gate dielectric layer disposed above the first semiconductor layer; and a gate metal layer disposed above the gate dielectric layer and having an effective workfunction selected to position the discrete hole level $H_0$ below the conduction band minimum $E_{c2}$ for zero bias applied to the gate metal layer and to obtain n-terminal characteristics.

Another embodiment is an n-channel transistor comprising a first semiconductor layer having a discrete hole level $H_0$; a second semiconductor layer having a conduction band minimum $E_{C2}$; a wide bandgap semiconductor barrier layer disposed between the first and the second semiconductor layers; a gate dielectric layer disposed above the first semiconductor layer; and a gate metal layer disposed above the gate dielectric layer and having an effective workfunction selected to position the discrete hole level $H_0$ below the conduction band minimum $E_{c2}$ for zero bias applied to the gate metal layer and to obtain p-terminal characteristics.

Yet another embodiment is an inverter circuit comprising an n-channel transistor with n-terminal characteristics comprising a first semiconductor layer having a first discrete hole level $H_0$; a second semiconductor layer having a conduction band minimum $E_{C2}$; a first wide bandgap semiconductor barrier layer disposed between the first and the second semiconductor layers; a first gate dielectric layer disposed above the first semiconductor layer; and a first gate metal layer disposed above the first gate dielectric layer and having a first effective workfunction selected to position the first discrete hole level $H_0$ below the conduction band minimum $E_{c2}$ for zero bias applied to the first gate metal layer and to obtain n-terminal characteristics. The n-channel transistor with n-terminal characteristics further comprises a first set of extensions having n-type conductivity. The inverter circuit further comprises an n-channel transistor with p-terminal characteristics comprising a third semiconductor layer having a second discrete hole level $H_0$; a fourth semiconductor layer having a second conduction band minimum $E_{C2}$; a second wide bandgap semiconductor barrier layer disposed between the third and fourth semiconductor layers; a second gate dielectric layer disposed above the third semiconductor layer; and a second gate metal layer disposed above the second gate dielectric layer and having a second effective workfunction selected to position the second discrete hole level $H_0$ below the second conduction band minimum $E_{c2}$ for zero bias applied to the second gate metal layer and to obtain p-terminal characteristics. The n-channel transistor with p-terminal characteristics further comprises a second set of extensions having n-type conductivity.

Another embodiment is an inverter circuit comprising a first semiconductor layer having a first discrete hole level $H_0$; a second semiconductor layer having a conduction band minimum $E_{C2}$; and a wide bandgap semiconductor barrier layer disposed between the first and the second semiconductor layers. The inverter circuit further comprises a first gate dielectric layer disposed above the first semiconductor layer; a first gate metal layer disposed above the first gate dielectric layer and having a first effective workfunction selected to position the first discrete hole level $H_0$ below the conduction band minimum $E_{c2}$ for zero bias applied to the first gate metal layer and to obtain n-terminal characteristics; a second gate dielectric layer disposed above the first semiconductor layer; and a second gate metal layer disposed above the second gate dielectric layer and having a second effective workfunction selected to position the second discrete hole level $H_0$ below the second conduction band minimum $E_{c2}$ for zero bias applied to the second gate metal layer and to obtain p-terminal characteristics.

Yet another embodiment comprises an n-channel transistor having n-terminal characteristics. The n-channel transistor comprises means for providing a layer having a discrete hole level $H_0$; means for providing a layer having a conduction band minimum $E_{C2}$; and means for providing a wide bandgap barrier between the layer having a discrete hole level $H_0$ and the layer having a conduction band minimum $E_{C2}$. The n-channel transistor further comprises means for providing a dielectric layer above the layer having a discrete hole level $H_0$; and means disposed above the dielectric layer for implementing a gate having an effective workfunction selected to position the discrete hole level $H_0$ below the conduction band minimum $E_{c2}$ for zero bias applied to the gate metal layer and to obtain n-terminal characteristics.

Yet another embodiment is an n-channel transistor having p-terminal characteristics. The n-channel transistor comprises means for providing a layer having a discrete hole level $H_0$; means for providing a layer having a conduction band minimum $E_{C2}$; and means for providing a wide bandgap barrier between the layer having a discrete hole level $H_0$ and the layer having a conduction band minimum $E_{C2}$. The n-channel transistor further comprises means for providing a dielectric layer above the layer having a discrete hole level $H_0$; and means disposed above the dielectric layer for implementing a gate having an effective workfunction selected to position the discrete hole level $H_0$ below the conduction band minimum $E_{c2}$ for zero bias applied to the gate metal layer and to obtain p-terminal characteristics.

Yet another embodiment is an inverter circuit comprising means for implementing a layer having a discrete hole level $H_0$; means for implementing a layer having a conduction band minimum $E_{C2}$; and means for implementing a wide bandgap barrier between the layer having a first discrete hole level $H_0$ and the layer having a conduction band minimum $E_{C2}$. The inverter circuit further comprises means for implementing a first dielectric layer above the layer having a discrete hole level $H_0$; means for implementing a first gate above the first dielectric layer having a first effective workfunction selected to position the first discrete hole level $H_0$ below the conduction band minimum $E_{c2}$ for zero bias applied to the first gate and to obtain n-terminal characteristics; means for implementing a second dielectric layer above the layer having a discrete hole level $H_0$; and means for implementing a second gate above the second gate dielectric layer having a second effective workfunction selected to position the second discrete hole level $H_0$ below the second conduction band minimum $E_{c2}$ for zero bias applied to the second gate and to obtain p-terminal characteristics.

Still another embodiment is a device including an n-channel transistor comprising a first semiconductor layer having a discrete hole level $H_0$; a second semiconductor layer having a conduction band minimum $E_{C2}$; and a wide bandgap semiconductor barrier layer disposed between the first and the second semiconductor layers; the n-channel transistor further comprises a gate dielectric layer disposed above the first semiconductor layer; and a gate metal layer disposed above the gate dielectric layer and having an effective workfunction selected to position the discrete hole level $H_0$ below the conduction band minimum $E_{c2}$ for zero bias applied to the gate metal layer and to obtain n-terminal characteristics.

Still another embodiment is a device including an n-channel transistor comprising a first semiconductor layer having a discrete hole level $H_0$; a second semiconductor layer having a conduction band minimum $E_{C2}$; and a wide bandgap semiconductor barrier layer disposed between the first and the second semiconductor layers; the n-channel transistor further comprises a gate dielectric layer disposed above the first semiconductor layer; and a gate metal layer disposed above the gate dielectric layer and having an effective workfunction selected to position the discrete hole level $H_0$ below the conduction band minimum $E_{c2}$ for zero bias applied to the gate metal layer and to obtain p-terminal characteristics.

Still another embodiment is a device including an inverter circuit comprising a first semiconductor layer having a first discrete hole level $H_0$; a second semiconductor layer having a conduction band minimum $E_{C2}$; and a wide bandgap semiconductor barrier layer disposed between the first and the second semiconductor layers. The inverter circuit further comprises a first gate dielectric layer disposed above the first semiconductor layer; a first gate metal layer disposed above the first gate dielectric layer and having a first effective workfunction selected to position the first discrete hole level $H_0$ below the conduction band minimum $E_{c2}$ for zero bias applied to the first gate metal layer and to obtain n-terminal characteristics; a second gate dielectric layer disposed above the first semiconductor layer; and a second gate metal layer disposed above the second gate dielectric layer and having a second effective workfunction selected to position the second discrete hole level $H_0$ below the second conduction band minimum $E_{c2}$ for zero bias applied to the second gate metal layer and to obtain p-terminal characteristics.

DETAILED DESCRIPTION

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Furthermore, the following description shows two or more layers in contact with each other. Such contact can be direct physical contact, or there may be an intervening layer and the contact is indirect, such as through indirect coupling.

The embodiments described herein provide a transistor in which the conducting channel is formed with conduction band electrons for both devices with p- and n-terminal characteristics using a common and simple semiconductor layer structure; that is, a uni-terminal device.

Figure 1:
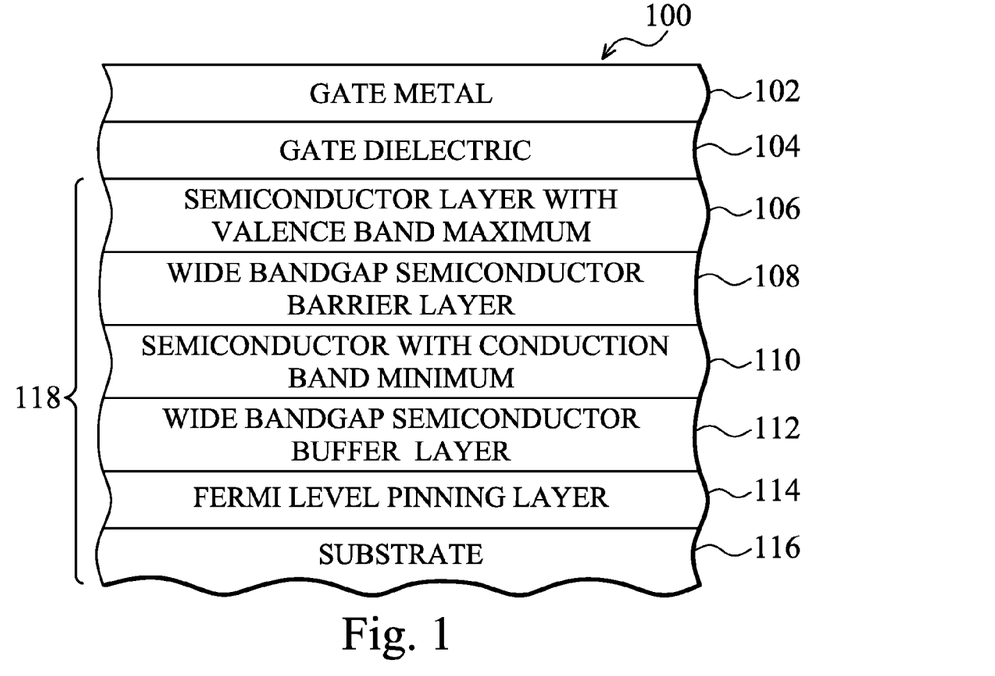
FIG. 1 illustrates a layer structure used in a uni-terminal transistor in accordance with one embodiment.

A layer structure used in a uni-terminal transistor according to one embodiment is shown in FIG. 1 and designated by a reference numeral 100. The layer structure 100 comprises a gate metal layer 102, a gate dielectric layer 104, a first semiconductor layer with a valence band maximum 106, a wide bandgap semiconductor barrier layer 108, a second semiconductor channel layer with a conduction band minimum 110, a wide bandgap semiconductor buffer layer 112, a Fermi level pinning layer 114, and a substrate 116. The gate metal layer 102 comprises a metal having an appropriate effective workfunction, as will be described in greater detail below. The material comprising the first semiconductor layer with the valence band maximum 106 is selected such that the valence band maximum $E_{v1}$ is located in the vicinity of the conduction band minimum $E_{c2}$ of the material comprising the second semiconductor layer with the conduction band minimum 110. The Fermi level pinning layer 114 pins the Fermi level at the backside of the structure 100 at an appropriate energy position, as will be described in greater detail below. Layers 106-116 are collectively designated by a reference numeral 118.

Figure 2:
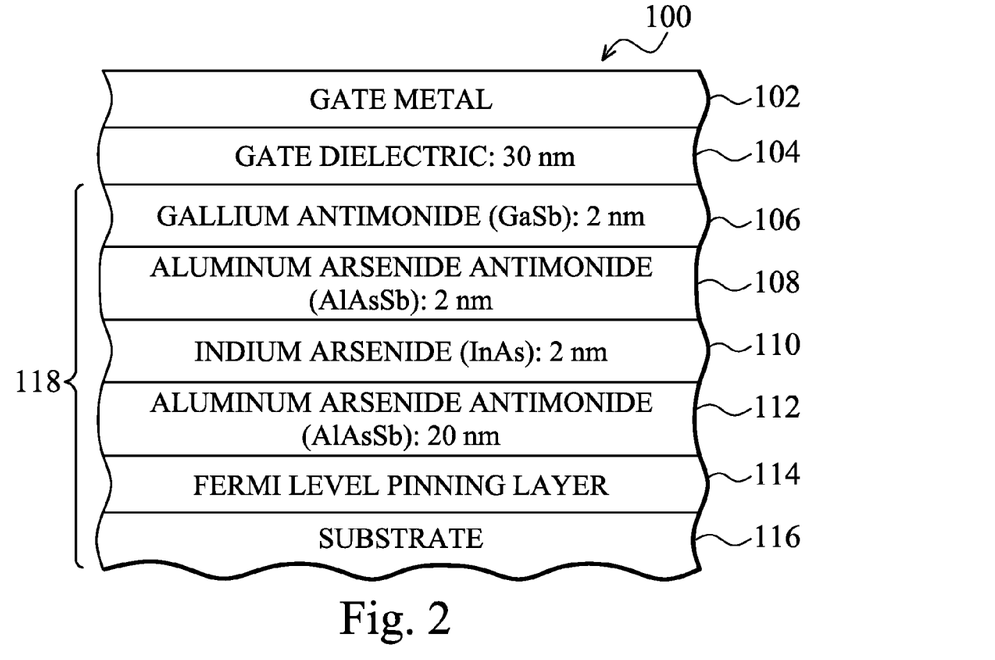
FIG. 2 is a more detailed illustration of the layer structure shown in FIG. 1.

FIG. 2 is a more detailed illustration of the layer structure 100. As shown in FIG. 2, the wide bandgap barrier and buffer layers 108 and 112 comprise AlAsSb, the first semiconductor layer 106 comprises GaSb, the second semiconductor channel layer 110 comprises InAs. For the selected materials, $E_{v1}$=−4.79 eV and $E_{c2}$=−4.9 eV. The Fermi level pinning layer 114 can comprise a wide bandgap semiconductor layer with a discrete energy level inside its bandgap, an interface of high defectivity, or a Schottky contact with appropriate barrier height.

In one embodiment, the gate dielectric layer 104 may comprise hafnium oxide ($HfO_2$) having a thickness of approximately 30 nm. In the same or another embodiment, the gate metal layer 102 may comprise one of tantalum nitride (TaN), titanium nitride (TiN), tungsten (W), tantalum (Ta), molybdenum (Mo), and ruthenium (Ru), among others. It will be recognized that regulation of the effective workfunctions of the foregoing metals may be may be accomplished via adjustment of process conditions to achieve the desired effective workfunction for the intended purpose, as described below.

Figure 3:
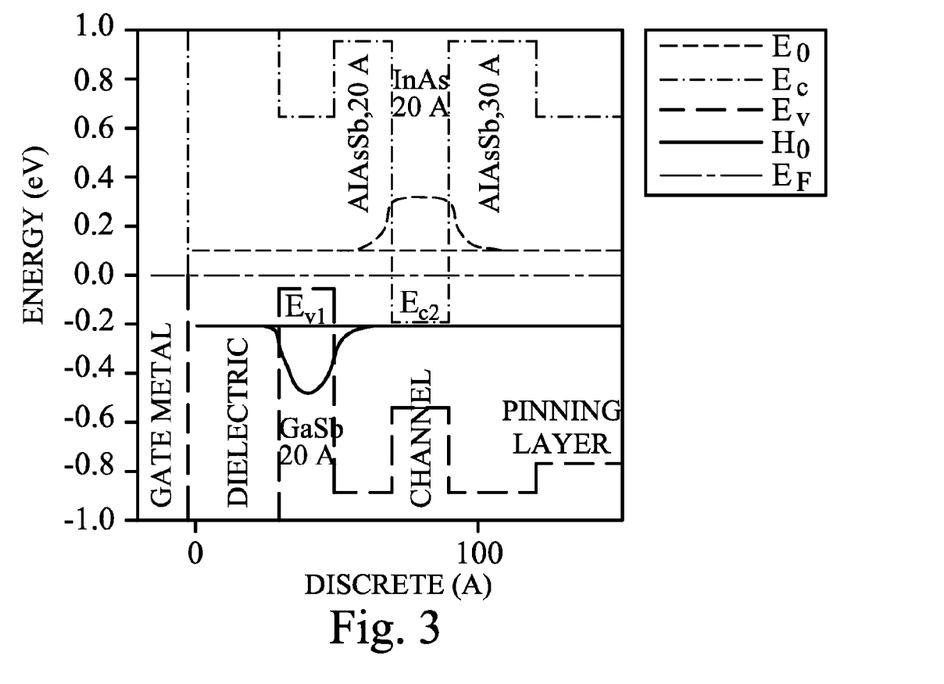
FIG. 3 is a calculated band diagram illustrating the relative energy levels of the layer structure shown in FIG. 2 in thermal equilibrium (bias=0 V).

FIG. 3 is a calculated band diagram illustrating the relative energy levels of the uni-terminal device layer structure depicted in FIG. 2 in thermal equilibrium (bias=0 V). The Fermi level $E_F$ is positioned at an absolute energy of −4.72 eV (relative energy 0 eV) using the Fermi level pinning layer 114. Flatband condition is obtained by selecting a metal with an effective workfunction $\Phi_m$ of 4.72 eV, which equals the Fermi level pinning position. In equilibrium and at zero bias, the discrete GaSb energy level $H_0$ shown with its wavefunction $\Psi_{Ho}$ (heavy or light hole level) is positioned below the InAs conduction band minimum $E_{c2}$. Since the discrete InAs energy level $E_0$ shown with its wavefunction $\Psi_{Eo}$ (electron ground level) is located substantially above $E_F$, the transistor is off and the electron sheet carrier concentration $n_S$ in the InAs channel layer is low. In the case shown in FIG. 3, $n_S$=7.3×10$^9$ cm$^{-2}$.

Figure 4:
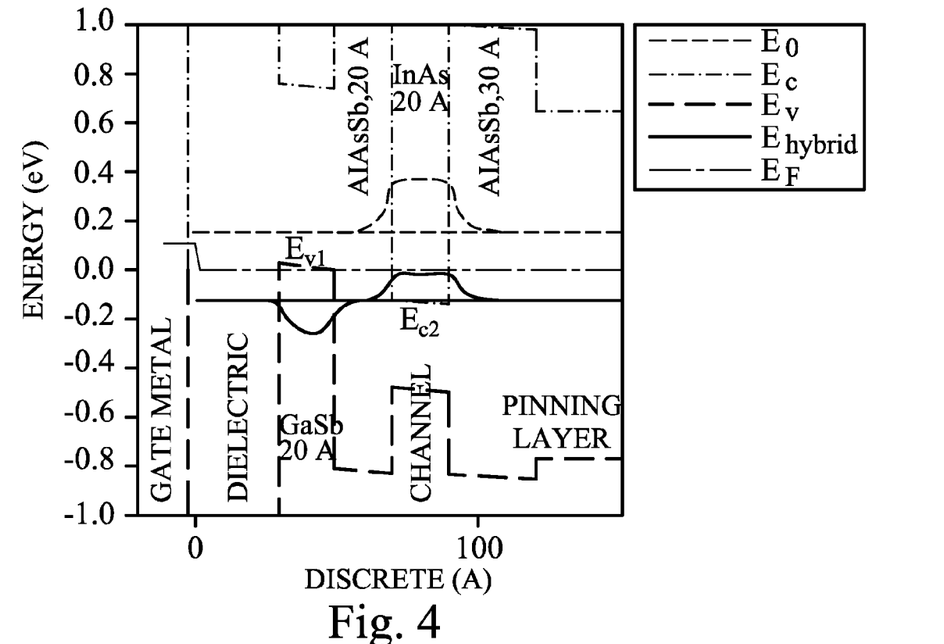
FIG. 4 is a calculated energy band diagram of the layer structure shown in FIG. 2 under a bias of −0.1 V applied to a gate electrode thereof.

FIG. 4 is a calculated energy band diagram of the uni-terminal device layer structure depicted in FIG. 2 under a bias of −0.1 V applied to the gate electrode. The hybrid state $E_{hybrid}$ (shown with its wavefunction $\Psi_{hybrid}$) is formed, which is situated substantially below $E_F$ and gives rise to an electron density $n_{on}$=2.9×10$^{12}$ cm$^{-2}$ in the conduction band of the InAs channel layer. Switching is assumed to occur almost instantaneously at the switch voltage $V_s$ when the hybrid state forms under appropriate gate bias. $V_S$ is somewhat above −0.1 V and is set equal to −0.1 V here for purposes of simplicity. Immediately before the hybrid state forms, the layer structure is off with $n_{off}$1.6×10$^9$ cm$^{-2}$ in the InAs channel layer conduction band, resulting in a switching ratio SR=$n_{on}/n_{off}$=1.84×10$^3$.

Figure 5:
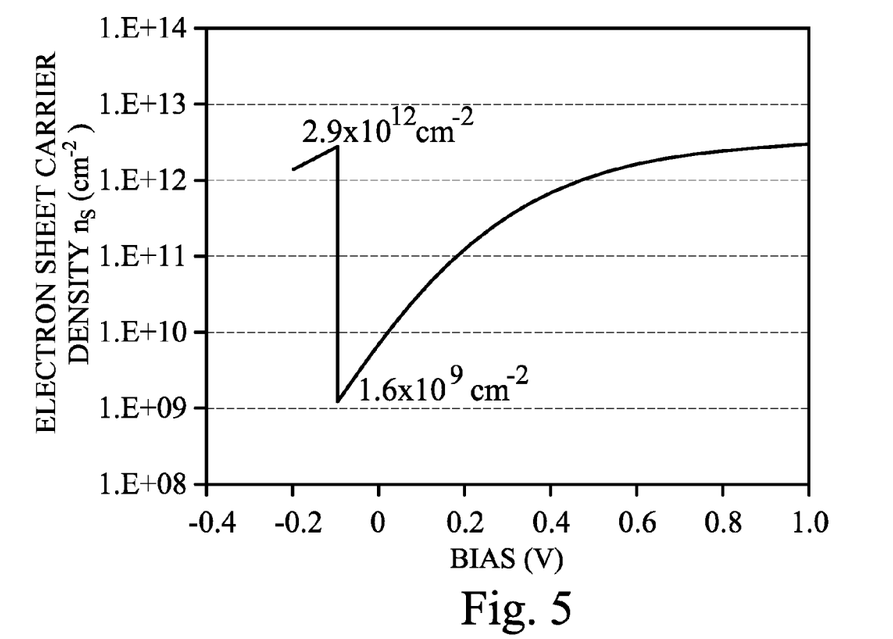
FIG. 5 illustrates the calculated electron sheet carrier density in the InAs layer $n_s$ as a function of gate bias V for the layer structure shown in FIG. 2.

FIG. 5 illustrates the calculated electron sheet carrier density in the InAs channel layer $n_s$ as a function of gate bias V for the uni-terminal device in accordance with the embodiment illustrated in FIG. 2. As previously described with reference to FIGS. 3-4, the electron channel in the InAs layer 110 turns on when the gate bias is lowered from 0 V to −0.1 V, resulting in p-terminal characteristics. The gate voltage at threshold (threshold voltage $V_t$) in p-terminal operation of the device is equal to the switch voltage $V_s$=−0.1 V. The formation of the hybrid state essentially acts as a dramatic electron density booster carrying the device almost immediately to high $n_{on}$. This is a desirable property for a "millivolt switch," as is the high SR for the uni-terminal layer structure shown in FIG. 2 in p-terminal operation. Switching may also not be as abrupt as indicated because of lateral inhomogeneities in layer thickness, composition, etc. Further, illustrated in FIG. 5, the layer structure 100 (FIG. 2) operates in standard n-terminal mode with a positive $V_t$ when the gate bias is increased above 0 V. Consequently, the uni-terminal layer structure 100 (FIG. 2) can operate with p- and n-terminal characteristics for negative and positive gate voltage, respectively. In both cases, the conducting channel is formed by conduction band electrons in the InAs channel layer 110.

Figure 6:
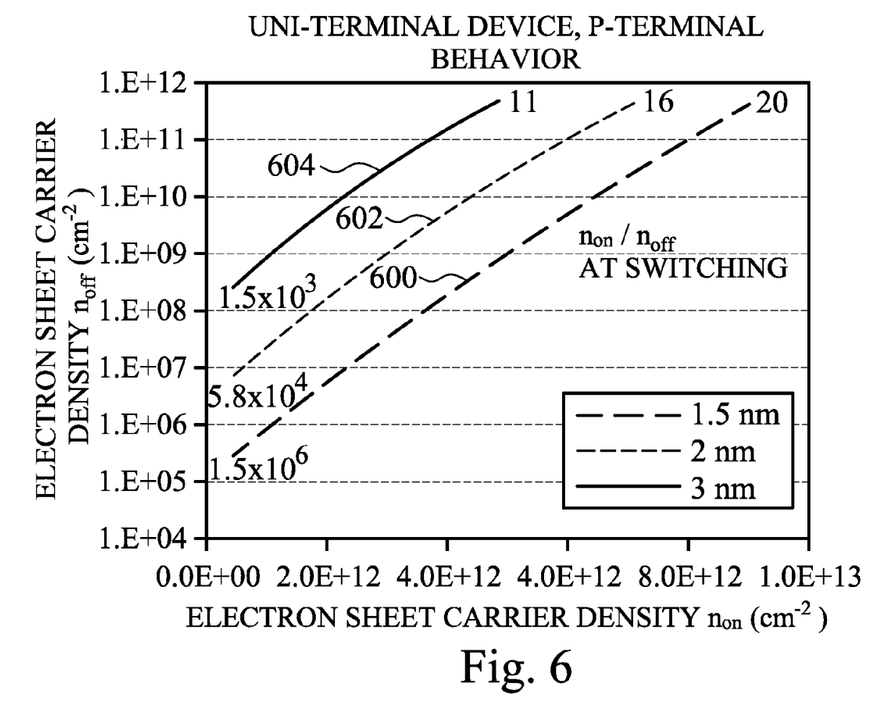
FIG. 6 illustrates the calculated InAs sheet electron concentration in off-state vs. on-state for different InAs layer thickness for p-terminal operation of the layer structure shown in FIG. 2 with $SR=n_{on}/n_{off}$ as a parameter.

FIG. 6 illustrates the calculated InAs sheet electron concentration in off-state vs. on-state for different InAs layer thickness for p-terminal operation of the uni-terminal layer structure 100 (FIG. 2) with SR=$n_{on}/n_{off}$ as a parameter. In particular, a line 600 corresponds to an InAs layer thickness of 1.5 nm (SR=1.5×10$^6$), a line 602 corresponds to an InAs layer thickness of 2.0 nm (SR=5.8×10$^4$), and a line 604 corresponds to an InAs layer thickness of 3.0 nm (SR=1.5× 10$^3$). Higher SR can be obtained with smaller InAs layer thickness. The lowest $n_{on}$ shown for all curves is 4.3×10$^{11}$ cm$^{-2}$. SR falls with higher $n_{on}$. A correct calculation of the hybridized state is expected to lead to $n_{on}$ values (and simultaneously $n_{off}$ values) that are higher by a factor of up to 3 due to higher unified effective mass and nonparabolicity. On the other hand, the resulting electric field may substantially reduce $n_{on}$ values and SR.

Figure 7:
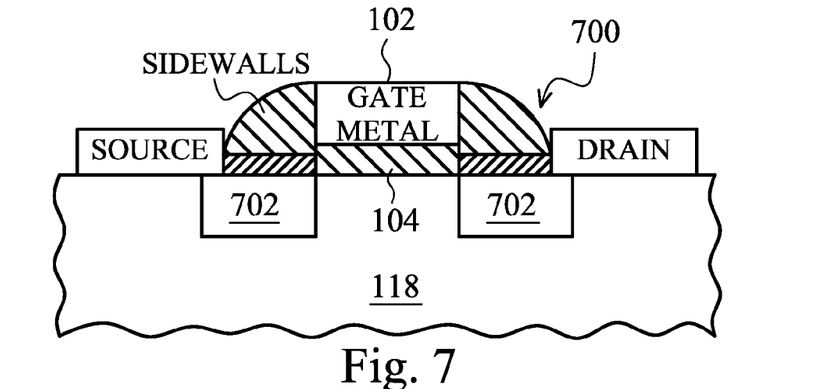
FIG. 7 illustrates a MOSFET fabricated using the layer structure of FIG. 2.

FIG. 7 illustrates a MOSFET 700 fabricated using the layer structure according to the embodiments shown in FIGS. 1 and 2. The n-type extensions 702 can be implemented using standard means such as ion implantation or virtual channels.

Figure 8:
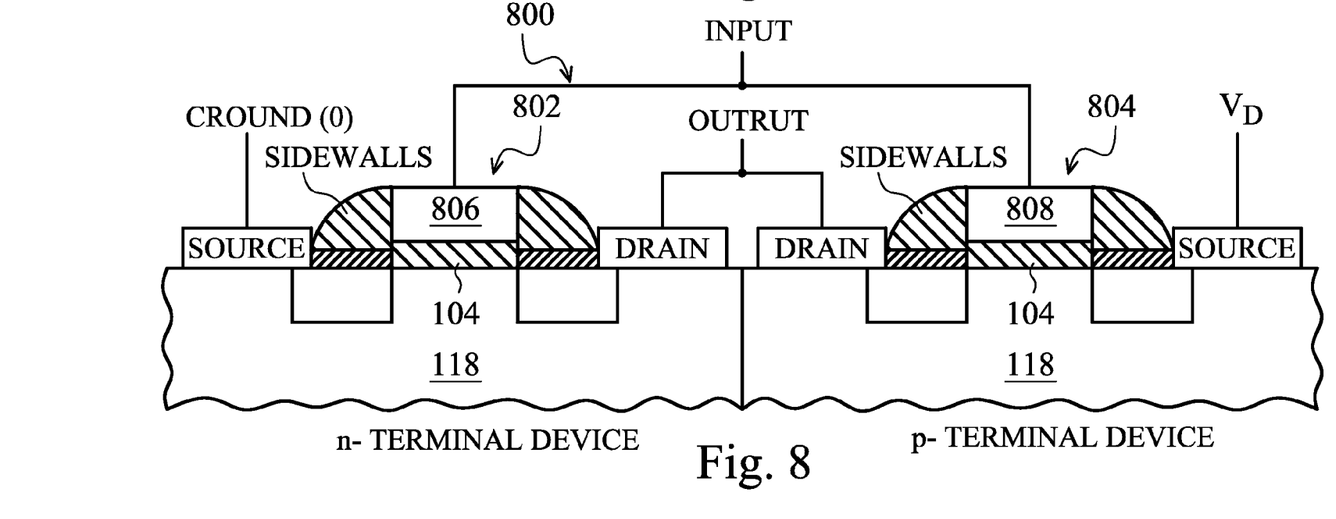
FIG. 8 illustrates a complementary inverter circuit comprising two uni-terminal devices connected in series fabricated using the layer structure of FIG. 2.

FIG. 8 illustrates a complementary inverter circuit 800 comprising two uni-terminal devices 802, 804, connected in series. The n-terminal device utilizes a gate metal 806 having an effective workfunction $\Phi_{m1}$, the p-terminal device employs a gate metal 808 having an effective workfunction $\Phi_{m2}$. In one particular embodiment, $V_D$=0.2 V, $\Phi_{m1}$=4.52 eV and $\Phi_{m2}$=4.72 eV.

Figure 9:
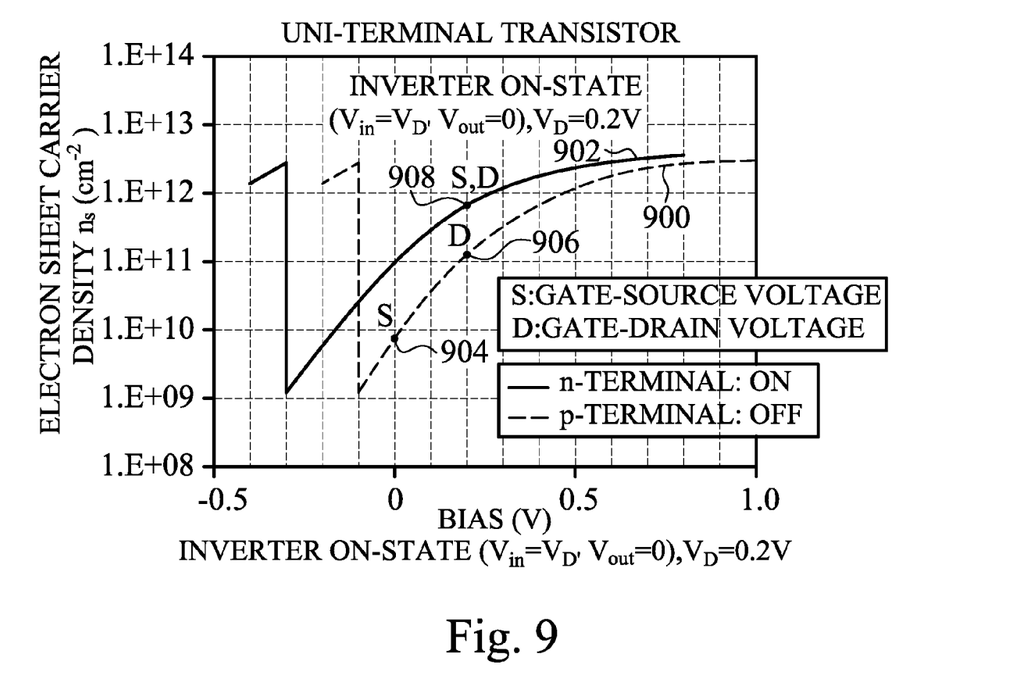
FIG. 9 illustrates channel electron charge vs. input voltage of the p- and n-terminal devices for the on-state of the inverter circuit of FIG. 8.

FIG. 9 illustrates channel electron charge vs. input voltage of the p-terminal device 804 (represented by a line 900) and the n-terminal device 802 (represented by a line 902) for the on-state of the inverter circuit 800 (FIG. 8). The gate-source voltage (S) and gate-drain voltage (D) operating points 904, 906, for the p-terminal device, respectively, and gate-source voltage and gate-drain voltage operating point 908 (which is the same for both voltages), for the n-terminal device, respectively, are also shown.

Figure 10:
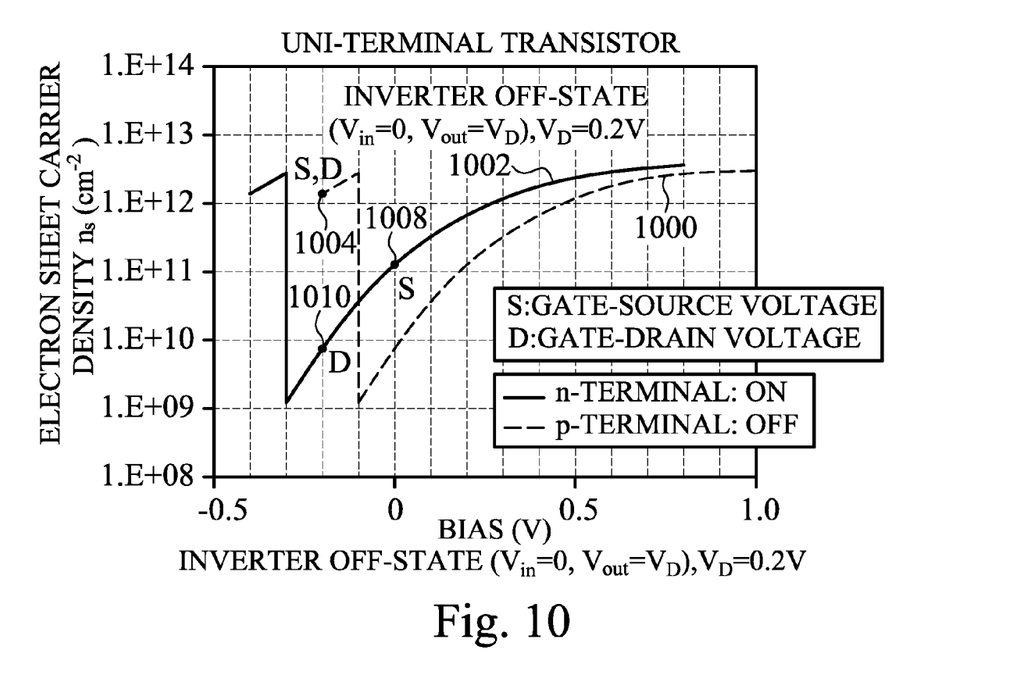
FIG. 10 illustrates channel electron charge vs. input voltage of the p- and n-terminal devices for the off-state of the inverter circuit of FIG. 8.

FIG. 10 illustrates channel electron charge vs. input voltage of the p-terminal device 804 (represented by a line 1000) and the n-terminal device 802 (represented by a line 1002) for the off-state of the inverter circuit 800 (FIG. 8). The gate-source voltage and gate-drain voltage operating point 1004 (which is the same for both voltages) for the p-terminal device and gate-source voltage and gate-drain voltage operating points 1008, 1010, for the n-terminal device, respectively, are also shown.

It will be noted that the embodiments described and illustrated herein may be advantageously employed in implementing high performance ("HP"), low operating power ("LOP"), and low standby power ("LSTP") devices. Moreover, all of the transistors described herein may be advantageously implemented in any electronic device and/or circuit that employs one or more transistors.

While the preceding shows and describes one or more embodiments, it will be understood by those skilled in the art that various changes in form and detail may be made therein without departing from the spirit and scope of the present disclosure. For example, various steps of the described methods may be executed in a different order or executed sequentially, combined, further divided, replaced with alternate steps, or removed entirely. In addition, various functions illustrated in the methods or described elsewhere in the disclosure may be combined to provide additional and/or alternate functions. Therefore, the claims should be interpreted in a broad manner, consistent with the present disclosure.

What is claimed is:

1. An inverter circuit comprising:
   an n-channel transistor with n-terminal characteristics comprising:
      a first semiconductor layer having a first discrete hole level $H_0$;
      a second semiconductor layer having a conduction band minimum $E_{C2}$;
      a first wide bandgap semiconductor barrier layer disposed between the first and the second semiconductor layers;
      a first gate dielectric layer disposed above the first semiconductor layer;
      a first gate metal layer disposed above the first gate dielectric layer and having a first effective workfunction selected to position the first discrete hole level $H_0$ below the conduction band minimum $E_{c2}$ for zero bias applied to the first gate metal layer and to obtain n-terminal characteristics; and
      a first set of extensions having n-type conductivity; and
   an n-channel transistor with p-terminal characteristics comprising:
      a third semiconductor layer having a second discrete hole level $H_0$;
      a fourth semiconductor layer having a second conduction band minimum $E_{C2}$;
      a second wide bandgap semiconductor barrier layer disposed between the third and fourth semiconductor layers;
      a second gate dielectric layer disposed above the third semiconductor layer; and
      a second gate metal layer disposed above the second gate dielectric layer and having a second effective workfunction selected to position the second discrete hole level $H_0$ below the second conduction band minimum $E_{c2}$ for zero bias applied to the second gate metal layer and to obtain p-terminal characteristics; and
   a second set of extensions having n-type conductivity.

2. The inverter circuit of claim 1 wherein the n-channel transistor with n-terminal characteristics further comprises: a substrate;
   a Fermi level pinning layer disposed on the substrate; and
   a wide bandgap buffer layer disposed between the second semiconductor layer and the Fermi level pinning layer.

3. The inverter circuit of claim 2 wherein the wide bandgap semiconductor buffer layer comprises AlAsSb.

4. The inverter circuit of claim 2 wherein the wide bandgap semiconductor buffer layer is approximately 20 nm thick.

5. The inverter circuit of claim 1 wherein the n-channel transistor with p-terminal characteristics further comprises:
   a substrate;
   a Fermi level pinning layer disposed on the substrate; and
   a wide bandgap buffer layer disposed between the fourth semiconductor layer and the Fermi level pinning layer.

6. The inverter circuit of claim 5 wherein the Fermi level pinning layer comprises a wide bandgap semiconductor layer with a discrete energy level inside its bandgap.

7. The inverter circuit of claim 5 wherein the Fermi level pinning layer comprises:
   an interface of high defectivity; and
   a Schottky contact having an appropriate barrier height.

8. The inverter circuit of claim 1 wherein an electron density in the second and fourth semiconductor layers increases abruptly in response to a negative bias applied to the respective gate metal layer.

9. An inverter circuit comprising:
   a first semiconductor layer having a first discrete hole level $H_0$;
   a second semiconductor layer having a conduction band minimum $E_{C2}$;
   a wide bandgap semiconductor barrier layer disposed between the first and the second semiconductor layers;
   a first gate dielectric layer disposed above the first semiconductor layer;
   a first gate metal layer disposed above the first gate dielectric layer and having a first effective workfunction selected to position the first discrete hole level $H_0$ below the conduction band minimum $E_{c2}$ for zero bias applied to the first gate metal layer and to obtain n-terminal characteristics;
   a third semiconductor layer having a second conduction band minimum $E_{C2}$;
   a fourth semiconductor layer disposed above the third semiconductor layer, the fourth semiconductor layer having a second discrete hole level $H_0$;
   a second gate dielectric layer disposed above the fourth semiconductor layer; and
   a second gate metal layer disposed above the second gate dielectric layer and having a second effective workfunction selected to position the second discrete hole level $H_0$ below the second conduction band minimum $E_{c2}$ for zero bias applied to the second gate metal layer and to obtain p-terminal characteristics.

10. The inverter circuit of claim 9 wherein the conduction band minimum $E_{C2}$=−4.9 eV.

11. The inverter circuit of claim 9 wherein the second effective workfunction is 4.72 eV.

12. The inverter circuit of claim 9 wherein the first semiconductor layer comprises GaSb having a thickness of approximately 2 nm.

13. The inverter circuit of claim 9 further comprising:
   a substrate;
   a Fermi level pinning layer disposed on the substrate; and
   a wide bandgap buffer layer disposed between the second semiconductor layer and the Fermi level pinning layer.

14. The inverter circuit of claim 13 wherein the Fermi level pinning layer comprises:
a wide bandgap semiconductor layer with a discrete energy level inside its bandgap;
an interface of high defectivity; and
a Schottky contact having an appropriate barrier height.

15. The inverter circuit of claim 9 wherein at least one of the first and second gate metal layers comprises a metal selected from a group consisting of TaN, TiN, W, Ta, Mo, and Ru.

16. A device including an inverter circuit comprising:
a first semiconductor layer having a first discrete hole level $H_0$;
a second semiconductor layer having a conduction band minimum $E_{C2}$;
a wide bandgap semiconductor barrier layer extending from the first semiconductor layer to the second semiconductor layer;
a first gate dielectric layer disposed above the first semiconductor layer;
a first gate electrode layer disposed above the first gate dielectric layer and having a first effective workfunction selected to position the first discrete hole level $H_0$ below the conduction band minimum $E_{c2}$ for zero bias applied to the first gate electrode layer and to obtain n-terminal characteristics;
a third semiconductor layer having a second conduction band minimum $E_{C2}$;
a fourth semiconductor layer disposed above the third semiconductor layer, the fourth semiconductor layer having a second discrete hole level $H_0$
a second gate dielectric layer disposed above the fourth semiconductor layer; and
a second gate electrode layer disposed above the second gate dielectric layer and having a second effective workfunction selected to position the second discrete hole level $H_0$ below the second conduction band minimum $E_{c2}$ for zero bias applied to the second gate electrode layer and to obtain p-terminal characteristics.

17. The device of claim 16 wherein the first effective workfunction is 4.52 eV.

18. The device of claim 16 wherein the wide band gap semiconductor barrier layer comprises AlAsSb and has a thickness of approximately 2 nm.

19. The device of claim 16 further comprising:
a substrate;
a Fermi level pinning layer disposed on the substrate; and
a wide bandgap buffer layer disposed between the second semiconductor layer and the Fermi level pinning layer.

20. The device of claim 16 wherein the device is at least one of a low operating power ("LOP") device, a high performance ("HP") device, and a low standby power ("LSTP") device.

* * * * *